United States Patent
Wong

Patent Number: 5,213,864
Date of Patent: May 25, 1993

[54] SILICONE ENCAPSULANT

[75] Inventor: Ching-Ping Wong, Lawrenceville, N.J.

[73] Assignee: AT&T Bell Laboratories, Murray Hill, N.J.

[21] Appl. No.: 802,579

[22] Filed: Dec. 5, 1991

[51] Int. Cl.$^5$ .................. B32B 3/26; H01L 23/28
[52] U.S. Cl. ................... 428/76; 428/68; 428/447; 257/787
[58] Field of Search .............. 428/76, 447, 68; 357/72

[56] References Cited

U.S. PATENT DOCUMENTS

| | | | |
|---|---|---|---|
| 4,888,226 | 12/1989 | Wong | 428/76 |
| 5,051,275 | 9/1991 | Wong | 428/76 |
| 5,085,913 | 2/1992 | Wong | 428/76 |

OTHER PUBLICATIONS

"Electrical Performance and Reaction Kinetics of Silicone Gels," by C. P. Wong, *Journal of Materials Research*, vol. 5, No. 4, Apr. 1990, pp. 795–800.

"Understanding the Use of Silicone Gels for Non-Hermetic Plastic Packaging," by C. P. Wong et al., *IEEE Transactions on Components, Hybrids and Manufacturing Technology*, vol. 12, No. 4, Dec. 1989, pp. 421–425.

*Primary Examiner*—Alexander S. Thomas
*Attorney, Agent, or Firm*—R. B. Anderson

[57] ABSTRACT

An electronic device encapsulant comprises polydimethyldiphenylmethylphenylsiloxane in which the mole ratio of the sum of the methyl-phenyl and diphenyl groups to the dimethyl groups is in the range of ten to forty percent. The normal bi-functional hydride terminations are replaced with tri-functional or tetra-functional hydride terminations.

8 Claims, 1 Drawing Sheet

SILICONE ENCAPSULANT

TECHNICAL FIELD

This invention relates to electronic devices which are encapsulated by a polymeric encapsulant and, more particularly, to such devices which are encapsulated by a silicone resin.

BACKGROUND OF THE INVENTION

Silicone resins have been used for a number of purposes because of their thermal stability, dielectric properties, chemical stability, and resistance to atmospheric deterioration. For example, the papers, "Electrical Performance and Reaction Kinetics of Silicone Gels," by C. P. Wong, *Journal of Materials Research*, Vol. 5, No. 4, April 1990, pp. 795–800, and "Understanding the Use of Silicone Gels for Non-Hermetic Plastic Packaging," by C. P. Wong et al., IEEE *Transactions on Components, Hybrids and Manufacturing Technology*, Vol. 12, No. 4, December 1989, pp. 421–425, describe the use of silicone resins as encapsulates for electronic devices, particularly integrated circuits.

The patent of Wong, U.S. Pat. No. 4,888,226, granted Dec. 19, 1989, is directed to a silicone resin that is particularly suitable for wire bonded hybrid integrated circuits. A hybrid integrated circuit is one in which a semiconductor chip, usually a silicon chip, is connected to a bonding pad region of a circuit pattern on a ceramic substrate. The patent describes the need for an encapsulant that will protect delicate bonding wires interconnecting the chip with the bonding pad under varying conditions of temperature and humidity, and with high integrated circuit bias voltages. While polydimethylsiloxane is adequate for most purposes, such silicone resins tend to crystallize at extremely low temperatures, such as temperatures below about $-35°$ C.($-31°$ F.). Such crystallization may break the delicate bonding wires and may crack the encapsulant to expose the electronic device to contaminants from the outside environment. There is therefore a continuing need for integrated circuit encapsulates that give a high degree of protection from outside contaminants, even under conditions of extreme cold.

SUMMARY OF THE INVENTION

Polydimethylsiloxane normally has two components, an A component that is vinyl terminated and a B component that is hydride terminated. Bonding or cross-linking of these terminations during cure gives the material its solid protective constituency. The problem of crystallization at low temperatures is combatted by two modifications. The first modification is to replace certain of the methyl groups of either or both of the two siloxane components with phenyl groups. Sufficient substitution is made such that the mole ratio of the sum of the methyl-phenyl and diphenyl groups to the dimethyl groups is in the range of ten to forty percent. The phenyl substitution interrupts the regularity of the siloxane molecule, tending to prevent crystallization. The other modification is to replace the normal di-functional hydride terminations with tri-functional or tetra-functional hydride terminations. The increased hydride terminations provide for more branching during the crosslinking process, thereby further reducing regularization of cross-linking.

These and other objects, features, and benefits of the invention will be better understood from a consideration of the following detailed description taken in conjunction with the accompanying drawing.

DETAILED DESCRIPTION

Figure 1:
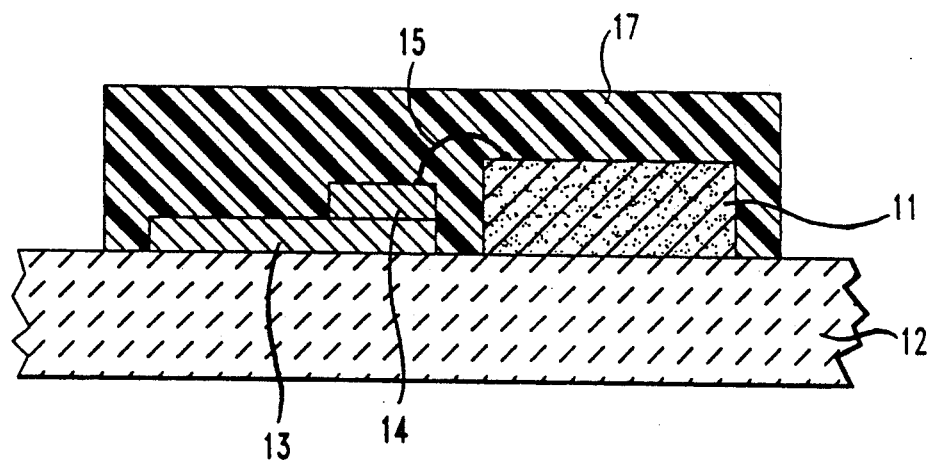
FIG. 1 is a schematic sectional view of part of an encapsulated hybrid integrated circuit in accordance with an illustrative embodiment of the invention.

Referring now to FIG. 1, there is shown schematically a hybrid integrated circuit comprising a silicon chip 11 mounted on a ceramic substrate 12, the surface of the substrate including a metal layer 13 defining a circuit pattern. The metal layer 13 includes a plurality of bonding pads 14 which make connections to the semiconductor chip by metal wires 15. In accordance with the invention, the entire exposed surface of the semiconductor chip, the metal wires 15, the bonding pads 14, and at least part of the metal layer 13 are covered by a silicone resin 17. After application, the resin is cured by heating it.

A known silicone that has been used, as shown in FIG. 1, is polydimethylsiloxane having vinyl and hydride functional components along with a platinum catalyst and a silicon dioxide filler. As is known, silicon hydrides may also be sued to increase the cross-linking density of the resin to increase its hardness. Cure may be made at one hundred fifty degrees Centigrade for two hours, although other cure times and temperatures of between one hundred twenty degrees Centigrade and two hundred degrees Centigrade may be used. The A component that is vinyl terminated crosslinks with the B component that is hydride terminated during cure.

A problem with the conventional heat curable siloxane resin is that is tends to crystallize at extremely low temperatures such as at $-40°$ C. The molecular structure of the polydimethylsiloxane is highly regularized having the form

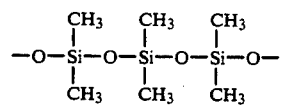

In accordance with one aspect of the invention, certain of the dimethyl groups of the molecule are replaced by methyl-phenyl and diphenyl groups so that the molecule has the form

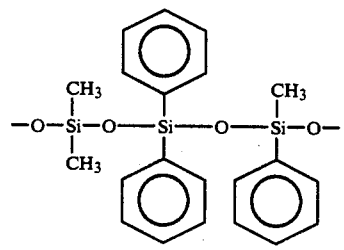

An alterative method of designating the substitution is as follows:

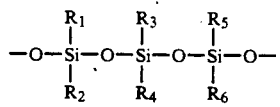

where $R_1$-$R_2$ is a dimethyl group, $R_3$-$R_4$ is a diphenyl group, and $R_5$-$R_6$ is a methyl-phenyl group. In accordance with the invention, the substitution is made such that the mole ratio of the sum of the methyl-phenyl and diphenyl constituents to the dimethyl constituent is in the range of ten to forty percent. This may be stated as follows:

$$0.10 < \frac{(R_5\text{-}R_6) + (R_3\text{-}R_4)}{(R_1\text{-}R_2)} < 0.40$$

Figure 2:
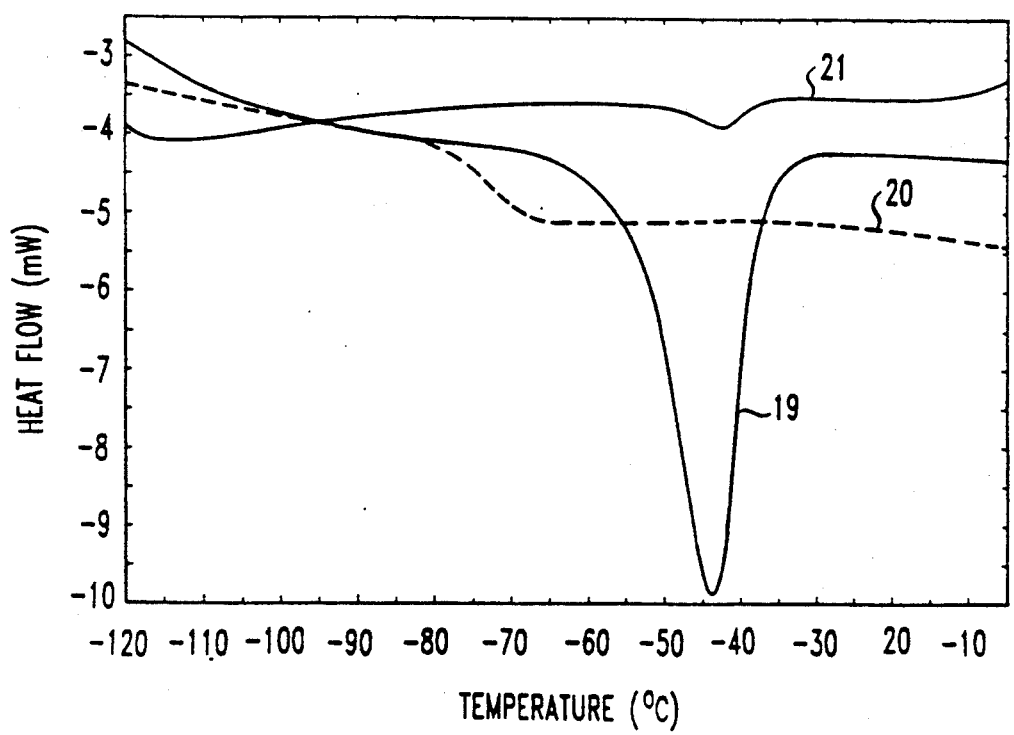
FIG. 2 is a graph of heat flow versus temperature in various encapsulants of the type that may be used in the device of FIG. 1.

One can see that the molecular form (2) does not have the regularity of (1) which makes the molecule less likely to freeze into the molecular regularization required for crystallization when the temperature is greatly reduced. This physical difference is illustrated in FIG. 2 in which curve 19 is the heat flow characteristic for conventional cured polydimethylsiloxane while curve 20 shows the heat flow characteristic for the material made in accordance with the invention which may be designated as polydimethyldiphenylmethylphenylsiloxane. The large change in heat flow between $-40°$ and $-50°$ C. for curve 19 is a manifestation of the change of heat flow resulting from crystallization of the material. This crystallization of course is verified by inspection of the material that is cooled to temperatures below $-40°$ C. The material of the invention characterized by curve 20 does not have any rapid change in the heat flow characteristic; this is also verified by visual inspection which does not show crystallization.

The B component of conventional polydimethylsiloxane is di-hydride terminated; that is, each molecule has two hydrogen atoms bonded at opposite ends of the molecule. In accordance with the invention, two to ten percent of the siloxane molecules are tri- or tetrahydride terminated, rather than di-hydride terminated. That is, each molecule contains three or four hydride terminations rather than only two. The remaining siloxane molecules are vinyl terminated as is conventionally the case. The substitution of the tri- or tetra-hydride terminations results in more branching during the cross-linking process which reduces tendencies toward crystallinity. This effect is manifested by curve 21, which is polydimethyldiphenylmethylphenylsiloxane in accordance with the invention with tri- and tetra-hydride terminations. The smaller heat flow represented by curve 21 with respect to curve 20 indicates an even lesser degree of crystallization than the device of curve 20.

The range of values o formula (4) is predicated on the estimate that a ten percent mole ratio is required for giving sufficient substitution to significantly reduce crystallization, but that a mole ratio greater than forty percent is likely to lead to steric hindrance. The two to ten percent of tri- or tetra-hydride terminations is based on a minimum of two percent for providing required crosslinking to the vinyl terminations and a maximum of ten percent for avoiding problems associated with excess hydrides, such as formation of excessive hydrogen gas during cure. Silicones to meet these specifications can be made by processes known in the art. Such vendors as Dow Corning of Midland, Michigan, can provide silicones meeting such specifications.

The embodiments described are intended only to be illustrative of the inventive concept. Other modifications and embodiments may be made by those skilled in the art without departing from the spirit and scope of the invention.

I claim:

1. An article of manufacture comprising: an electronic device encapsulated by a material including a silicone resin, wherein:
   the silicone resin is a siloxane containing dimethyl, diphenyl, and methyl-phenyl constituents, the mole ratio of the sum of the methyl-phenyl and diphenyl constituents to the dimethyl constituents being in the range of ten or forty percent;
   a first portion of the siloxane comprises molecules that are vinyl terminated, and a second portion of the siloxane comprises molecules that are hydride terminated;
   two to ten percent of the siloxane has hydride terminations selected form the group consisting of tri-functional hydride terminations and tetra-functional hydride terminations; and
   the resin contains a platinum catalyst to aid in cross-linking thereof.

2. The article of claim 1 wherein:
   the encapsulation is substantially undamaged by exposure to temperatures of less than $-40°$ C.

3. An article of manufacture comprising:
   an electronic device encapsulated by a material including a silicone resin, wherein the silicone resin comprises a siloxane having the molecular from

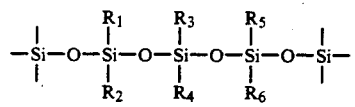

where $R_1$-$R_2$ is a dimethyl constituent, $R_3$-$R_4$ is a diphenyl constituent, $R_5$-$R_6$ is a methyl-phenyl constituent, and the mole ratio of the sum of methyl-phenyl and diphenyl constituents to the dimethyl constituent is in the range of ten to forty percent.

4. The article of claim 3 wherein:
   the resin comprises a platinum catalyst, and the siloxane has vinyl and hydride functional molecular terminations.

5. The article of claim 4 wherein:
   that siloxane not hydride terminated is vinyl terminated.

6. The article of claim 5 wherein:
   two to ten percent of the siloxane has molecular terminations selected from the group consisting of tri-functional hydride terminations and tetra-functional hydride terminations.

7. An article of manufacture comprising an electronic device encapsulated by a silicone resin, wherein:
   the resin is polydimethyldiphenylmethylphenylsiloxane.

8. The article of claim 7 wherein:
   two to ten percent of the resin molecules have molecular terminations selected from the group consisting of tri-functional and tetra-functional hydride terminations, and the remainder of the resin molecules have vinyl terminations.

* * * * *